United States Patent [19]

Yano et al.

[11] 4,329,660
[45] May 11, 1982

[54] SEMICONDUCTOR LIGHT EMITTING DEVICE

[75] Inventors: Mitsuhiro Yano; Hiroshi Nishi; Masahito Takusagawa; Yorimitsu Nishitani, all of Kawasaki, Japan

[73] Assignee: Fijitsu Limited, Kawasaki, Japan

[21] Appl. No.: 120,095

[22] Filed: Feb. 11, 1980

[30] Foreign Application Priority Data

Feb. 13, 1979 [JP] Japan .................................. 54-15617
Mar. 16, 1979 [JP] Japan .................................. 54-31356
Mar. 16, 1979 [JP] Japan .................................. 54-31357

[51] Int. Cl.³ ............................................. H01S 3/19
[52] U.S. Cl. ...................................... 372/46; 357/17; 372/45
[58] Field of Search .................. 331/94.5 H; 357/17, 357/18

[56] References Cited

U.S. PATENT DOCUMENTS 4,033,796 7/1977 Burnham et al. ............... 148/175 X

OTHER PUBLICATIONS

Yano et al, "Oscillation Characteristics in InGaAsP-/InP DH Lasers with Self-Aligned Structure", IEEE JQE, vol. QE-15, No. 12, Dec. 1979, pp. 1388–1395.
Nishi et al, "Self-Aligned Structure InGaAsP/InP DH Lasers", Appl. Phys. Lett. 35(3), Aug. 1, 1979, pp. 232–234.

Primary Examiner—James W. Davie
Attorney, Agent, or Firm—Staas & Halsey

[57] ABSTRACT

In a semiconductor light emitting device, a buried layer of a semiconductor is selectively formed in at least one of a first and a second clad layers in order to determine a light emitting region by the configuration of the buried layer of the semiconductor. The buried layer of the semiconductor has a conductivity type which is opposite to the conductivity type of the surrounding clad layer and an index of refraction which is different from the index of refraction of the surrounding clad layer.

17 Claims, 13 Drawing Figures

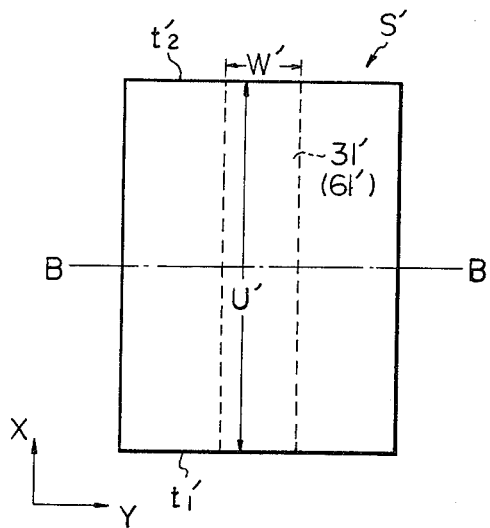
Fig. IA
PRIOR ART
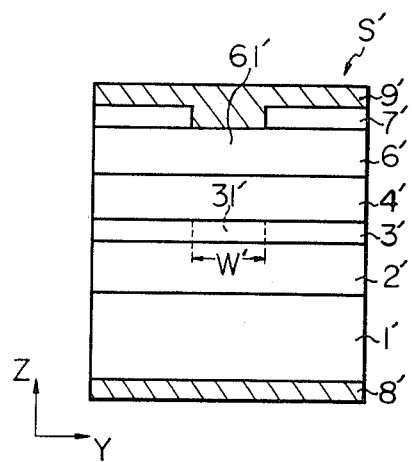
Fig. IB
PRIOR ART

SEMICONDUCTOR LIGHT EMITTING DEVICE

BACKGROUND OF THE INVENTION

1 Field of the Invention

The present invention relates to a semiconductor light emitting device, more particularly to a semiconductor laser of double hetero structure and of stripe geometry, comprising a first semiconductor layer of an active region and second and third layers adjacent to the first semiconductor layer having a greater energy gap and a smaller index of refraction (of light) than those of the first layer. Such a semiconductor laser is used, for example, for a light source for a long distance and a high bit rate light transmission system using a single mode optical fiber. Gallium-aluminium-arsenic/-gallium-arsenic-($Ga_{1-2}Al_xAs/GaAs$) and indium-gallium-arsenic-phosphorus/indium-phosphorus ($In_{1-x}Ga_x$-$As_yP_{1-y}$/InP) are used for the material of such a semiconductor laser.

2. Description of the Prior Art

A prior art structure of such a semiconductor laser is illustrated in FIGS. 1A and 1B. The semiconductor laser S' comprises an n type semiconductor substrate 1' of InP, an n type clad (cladding) layer 2' of InP, an active layer 3' of $In_{1-x}Ga_x$-$As_yP_{1-y}$, the constitution parameters x and y being, for example, approximately 0.7 and 0.6, respectively, for the wavelength 1.3 μm of the light, a P type clad layer 4' of InP, and a P type ohmic contact layer 6' of $In_{1-x}Ga_xAs_yP_{1-y}$. The clad layers 2' and 4' the active layer 3' and the ohmic contact layer 6' are formed by means of the continuous liquid phase growth process. An insulating layer 7' is formed to cover the ohmic contact layer 6', except for a stripe portion 61', so that a stripe region 31' which forms a light emitting region of the semiconductor laser is defined. On the bottom of the semiconductor substrate 1', and on the top of the insulating layer 7' and the stripe portion 61', a negative electrode 8' and a positive electrode 9' are formed, respectively. The clad layers 2' and 4' have a greater energy gap and a smaller index of refraction of light than those of the active layer 3'. In order to define the stripe region 31', the proton irradiation process or the impurity diffusion process can be used, instead of the above described process for forming the insulating layer 7'. Both end mirrors t'$_1$ and t'$_2$ of the semiconductor laser S' are usually formed by the cleaving process.

However, the prior art semiconductor laser of FIGS. 1A and 1B has the following disadvantages. That is, although a laser oscillation occurs in the active layer 3' due to the injected current which passes through the stripe portion 61', the Y-direction oscillation mode in the active layer 3' is determined only by the stimulated emission gain in the Y-direction due to the injected carriers and no change of the index of refraction of light exists in the Y-direction. Accordingly, the threshold current of the semiconductor laser is caused to be high and the external differential quantum efficiency of the semiconductor laser is caused to be low.

As a result, in the prior art semiconductor laser of FIGS. 1A and 1B, an intense stimulated emission occurs in the neighborhood of the center of the oscillating portion when the excitation attains high level, so that an irregular operation condition appears in the usual oscillation mode and the oscillation characteristic of the semi-conductor laser is caused to be unstable. This unstable oscillation characteristic makes the current versus optical output characteristic of the semiconductor laser in the steady state nonlinear and makes it impossible to obtain outputs which are greater than a predetermined value. In addition, the oscillation is caused to be irregular and no clean Gaussian distribution is obtained in the current versus optical output characteristic.

In connection with the semiconductor laser illustrated in FIGS. 1A and 1B, it should be noted that the distribution of the gain of the semiconductor laser corresponding to the change of the index of refraction can be expressed as indicated in FIG. 2. In FIG. 2, the line C(n) represents the distribution of the index of refraction along Y-direction of FIGS. 1A and 1B. The value of the index of refraction is $n_1$, within the range w', which is the width of the stripe, and is $n_2$ outside the range w'. The difference Δn which is equal to $n_1-n_2$ is, neary zero for the prior art semiconductor laser. The curve C(g) indicates that the gain g of the semiconductor laser attains a high value within the range w'. The maximum value of the gain g is, for example, 70($cm^{-1}$) to 90($cm^{-1}$).

An example of prior art striped semiconductor light emitting devices is disclosed in the Japanese Patent Application Laid-open Publication No. 53-138689, corresponding to the United States patent application No. 794466, now U.S. Pat. No. 4,169,997.

SUMMARY OF THE INVENTION

The present invention is proposed in order to solve the above described problems in the prior art semiconductor laser with the double heterostructure.

It is the principal object of the present invention to improve the linearity of the current to optical output characteristic, to reduce the threshold current of the semiconductor laser and to increase the external differential quantum efficiency of the semiconductor laser.

In accordance with the present invention a semiconductor light emitting device is provided in which a buried layer of semiconductor, having a conductivity type which is opposite to the conductivity type of the surrounding clad layer and an index of refraction which is different from the index of refraction of the surrounding clad layer, is selectively formed in at least one of a first and a second clad layers, whereby a light emitting region is determined by the configuration of the buried layer of semiconductor.

BRIEF DESCRIPTION OF THE DRAWINGS

FIGS. 1A and 1B illustrate the structure of the prior art semiconductor laser, FIG. 1B being a cross-sectional view taken along the line B—B of FIG. 1A;

DESCRIPTION OF THE PREFERRED EMBODIMENTS

Figure 3A:
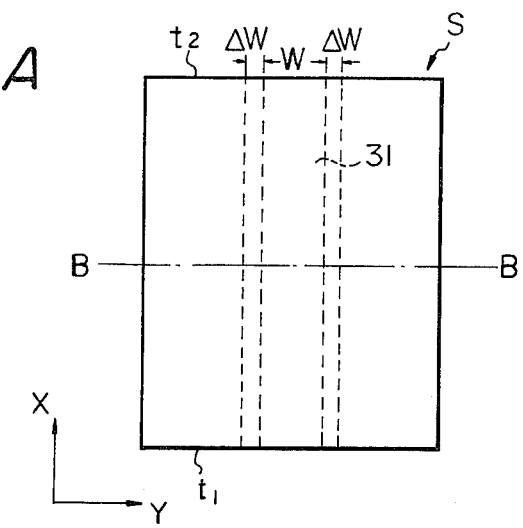
FIGS. 3A and 3B illustrate the structure of the semiconductor laser in accordance with embodiments of the present invention, FIG. 3B being a cross-sectional view taken along the line B—B of FIG. 3A.
Figure 3B:
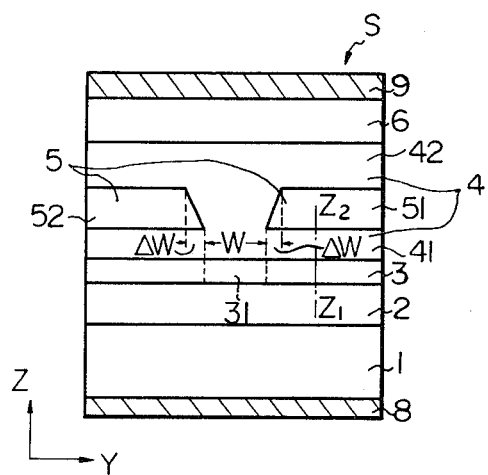

The structure of a semiconductor laser in accordance with embodiments of the present invention is illustrated in FIGS. 3A and 3B. The semiconductor laser S comprises a semiconductor substrate 1 of n type InP a first clad layer 2 of n type InP grown on the semiconductor substrate 1, an active layer 3 of $In_{1-x}Ga_xAs_yP_{1-y}$ grown on the first clad layer 2, a second clad layer 4 of p type InP grown on the active layer 3, a buried layer 5 of high or low index of refraction of n type $In_{1-x}Ga_x$-$As_yP_{1-y}$ formed in a predetermined region of the second clad layer 4, and a ohmic contact layer 5 of p type $In_{1-x}Ga_xAs_yP_{1-y}$ grown on the second clad layer 4. A positive electrode layer 9 of titanium layer-platinum layer-gold layer (Ti-Pt-Au) is formed on the ohmic contact layer 6, and a negative electrode layer 8 of gold-germanium-nickel(Au-Ge-Ni) is formed on the bottom of the semiconductor substrate 1.

The buried layer 5 has an index of refraction which is different from, that is, either higher or lower than, that of the second clad layer 4 and has a conductivity type which is opposite to that of the second clad layer 4. In the case where the index of refraction of the buried layer 5 is higher than that of the second clad layer 4, it has been confirmed, as a result of an investigation conducted by the inventors of the present invention, that the index of refraction of the buried layer 5 should be greater by more than a predetermined value than the index of refraction of the second clad layer.

The buried layer 5 consisting of the portions 51 and 52 determines the width w of the light emitting striped region 31 of the active layer 3. Due to the actual process to form the buried layer 5, ends of the portions 51 and 52 define the sloping boundaries having boundary widths Δw, respectively.

The buried layer 5 has a conductivity type which is opposite to the conductivity type of the second clad layer 4. When a light emission exciting voltage is applied between the electrode layers 9 and 8, either the PN junction between the buried layer 5 and the lower part of the second clad layer 41 or the PN junction between the buried layer 5 and the upper part of the second clad layer 42 is caused to be biased in the reverse direction (in the case of the examples described later, the PN junction between the buried layer 5 and the second clad layer 41 is caused to be biased in the reverse direction), and accordingly no light emission exciting current passes through the portions of the active layer 3 located immediately beneath the buried layer 5. The light emission exciting current concentrates through the region 31 of the active layer 3 which does not correspond to the buried layer 5. Thus, a so-called "current confinement" is achieved and the width of the light emitting region is determined.

The constitution parameters x, y of the active layer 3 of $In_{1-x}Ga_xAs_yP_{1-y}$ is determined so as to maintain the lattice matching with the semiconductor substrate and the like, and to provide the desired oscillation wavelength. Also, the constitution of the buried layer 5 of $In_{1-x}Ga_xAs_yP_{1-y}$ is determined so as to maintain the lattice matching with the other semiconductor layers.

In the case where the buried layer 5 has a higher index of refraction than that of the second clad layer 4, the materials and constitutions of the semiconductor layers are selected to satisfy the following conditions, where the energy gaps of the first clad layer 2, the active layer 3, the second clad layer 4 and the buried layer 5 are Eg(2), Eg(3), Eg(4) and Eg(5), respectively.

Eg(3)≦Eg(5)
Eg(5)<Eg(2)
Eg(5)<Eg(4)

In the case where the buried layer 5 has a lower index of refraction than that of the second clad layer 4, the materials and constitution of the semiconductor layers are selected to satisfy the following conditions.

Eg(3)<Eg(2), Eg(4)
Eg(4)<Eg(5)

Figure 4A:
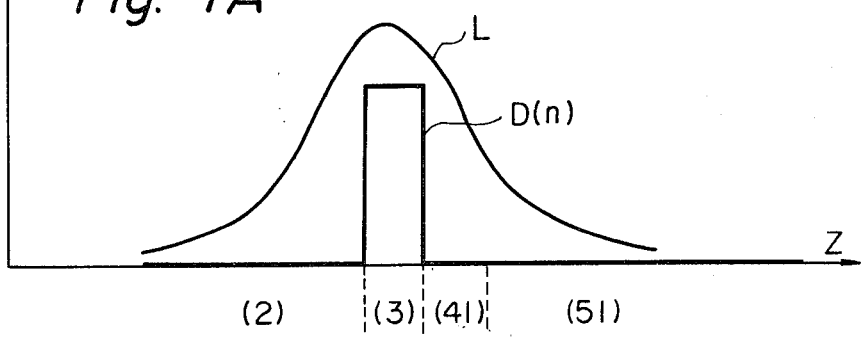
FIGS. 4A, 4B and 4C illustrate the distributions of the difference in the index of refraction and the light intensity in the semiconductor laser of FIGS. 3A and 3B.
Figure 4B:
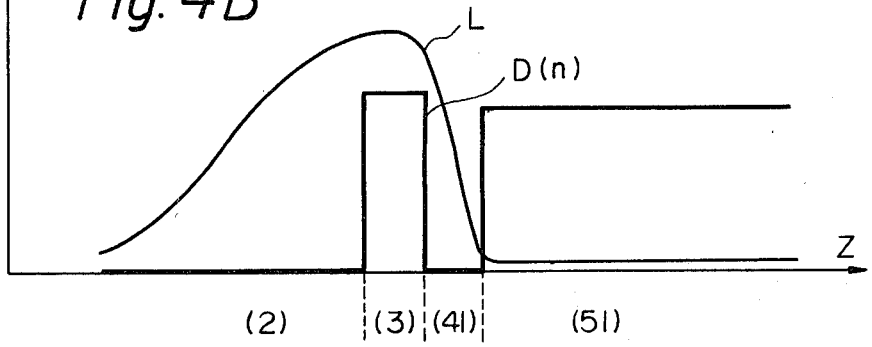
Figure 4C:
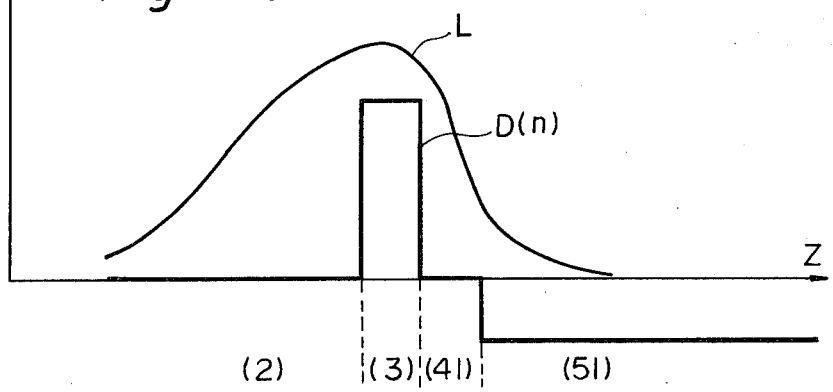

The distributions of the difference D(n) of the index of refraction and the light intensity L of the semiconductor laser of FIGS. 3A and 3B, along the line $Z_1-Z_2$ in FIG. 3B, are illustrated in FIGS. 4A, 4B and 4C. D(n) is the value of the index of refraction of a certain semiconductor layer minus the value of the index of refraction of the first and the second clad layers 2 and 41. In FIG. 4A, the index of refraction of the buried layer 51 is equal to that of the first and the second clad layers 2, 4. In FIG. 4B, the index of refraction of the buried layer 51 is higher than that of the first and the second clad layers 2, 4. In FIG. 4C, the index of refraction of the buried layer 51 is lower than that of the first and the second clad layers 2, 4.

Figure 2:
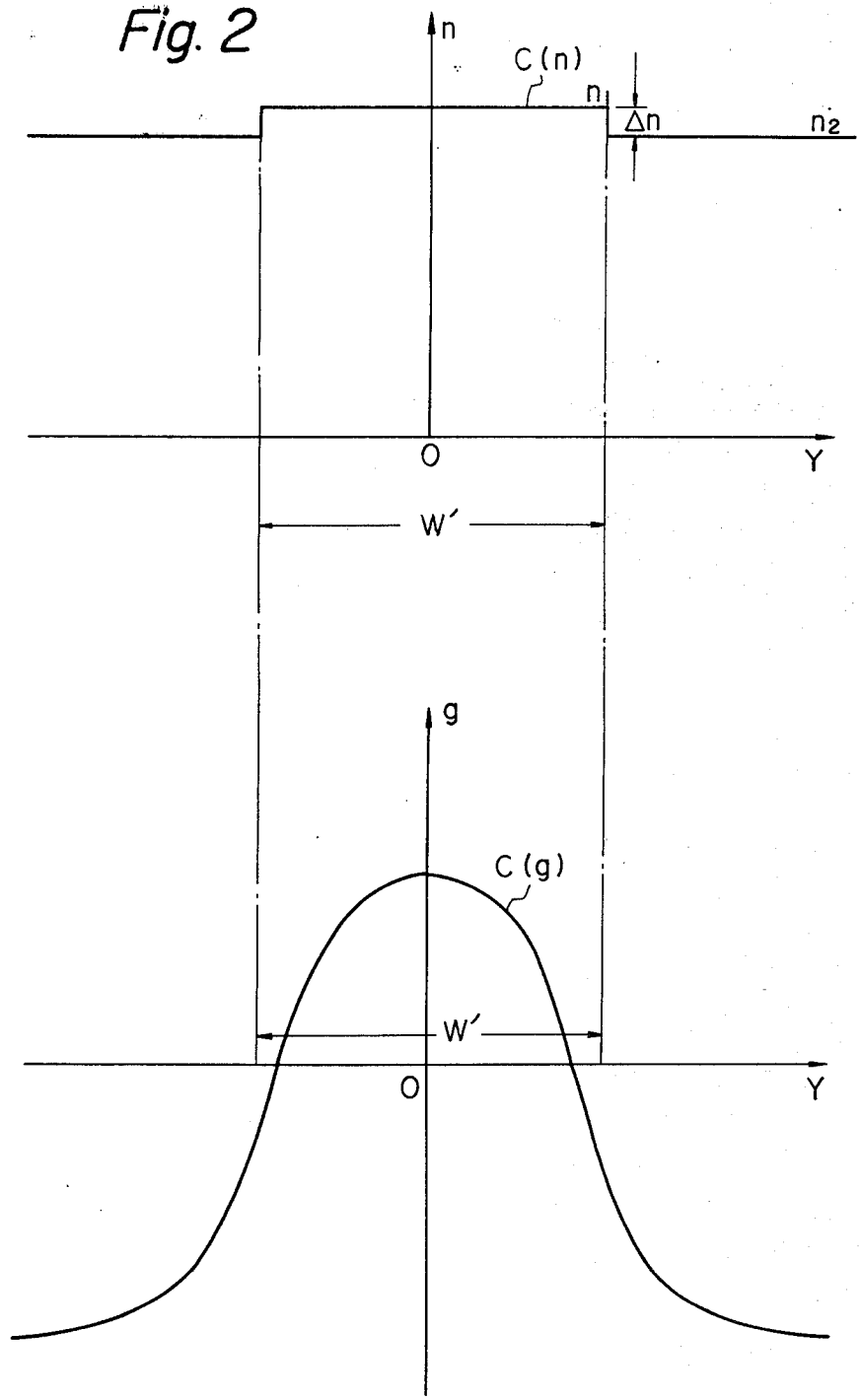
FIG. 2 illustrates the distributions of the index of refraction and the gain in the semiconductor laser of FIGS. 1A and 1B.

In FIG. 4B, the distribution of the index of refraction acts as a reflector of the light power, so that the light power is pushed to the side of the first clad layer 2, as indicated by the light intensity curve L which has a swollen configuration in the left hand side. Also, in FIG. 4C, the distribution of the index of refraction causes the light power to be pushed to the side of the first clad layer 2, as indicated by the light output curve L which has a swollen configuration in the left hand side. Thus, in both cases of FIGS. 4B and 4C, the light power is pushed to the side of the first clad layer 2. This pushing of the light power is regarded as equivalent to a reduction of the effective index of refraction of the portion along the line $Z_1-Z_2$, and accordingly, an increase of the effective index of refraction of the portion 31 of the semiconductor laser. This increase of the effectively index of refraction of the portion 31 is very advantageous in the characteristic of the semiconductor laser, from the viewpoint of the characteristic explained hereinbefore with reference to FIG. 2.

In the case where the buried layer has a higher index of refraction than that of the second clad layer 4, the lateral mode width 2w, which is the entire distance between the points at which the light intensity is $1/e^2$, is express by the following equation.

$$2w = 2\left(\frac{\lambda}{\pi a_r^{\frac{1}{2}}}\right)^{\frac{1}{2}} \quad (1)$$

where $$a_r^2 = \frac{4n_r\Delta n}{(w+2\Delta w)^2} + \left[\left(\frac{4n_r\Delta n}{(w+2\Delta w)^2}\right)^2 + \left(\frac{n_r g_o}{4\pi x_o^2}\right)^2\right]^{\frac{1}{2}}$$

$$n_r = [\epsilon_{23}\Gamma + \epsilon_{22}(1-\Gamma)]^{\frac{1}{2}}$$

$\lambda$: oscillation wavelength in vacuum
$\Gamma$: optical confinement coefficient in Z-direction
$\Delta n$: difference in the indices of refraction
w: width of the light emitting region
$g_o$: the central value of the distribution of the gain
$X_o$: distance between the center of the distribution curve of the gain and the point at which the gain is zero
$\epsilon_{23}$: dielectric constant of the active layer
$\epsilon_{22}$: dielectric constant of the first clad layer When the difference in the indices of refraction $\Delta n$ is approximately $10^{-2}$, the lateral mode width depends only slightly on the distribution of the gain, and a condition can be obtained in which the lateral mode width is dependent only on the difference in the indices of refraction. If the width w of the light emitting region is in the range from 4 to 7 $\mu$m, the greater part of the lateral oscillation mode is effectively confined in the width w of the light emitting region. However, if the width w of the light emitting region is smaller than 3 $\mu$m, the leakage of the light in the lateral direction increases, and if the width w of the light emitting region is greater than 8 $\mu$m, the control due to the difference in the indices of refraction is caused to be ineffective. Therefore, a range which is shorter than 3 $\mu$m or greater than 8 $\mu$m is undesirable. The above mentioned equation (1) is described in, for example, a thesis by D. D. Cook, F. R. Nash and other persons, in the Journal of Applied Physics, Vol. 46, No. 4, Pages 1660 to 1672, published in 1975.

In the semiconductor laser of FIGS. 3A and 3B, the thickness of the active layer 3 is selected so as to make the threshold current a minimum, the suitable range of the thickness being approximately 0.05 to 0.3 $\mu$m. The value of the thickness of the portion 41 of the clad layer 4 between the active layer 3 and the portion 51 of the buried layer 5 is important because the electromagnetic field distributes through the portion 41. The suitable range of the thickness of the portion 41 is approximately 0.2 to 0.5 $\mu$m. The optimum thickness of the buried layer 5 is a function of the thickness of the active layer 3 and the thickness of the portion 41. The suitable thickness of the buried layer 5 is approximately 0.2 to 2 $\mu$m. The thickness of the first clad layer 2 and the second clad layer 4 are so selected as to enable sufficient attenuation of the electromagnetic field outside of the central region of the width w of the semiconductor laser. The suitable thickness of the first clad layer 2 is approximately 1 to 5 $\mu$m, while the suitable thickness of the second clad layer 4 is approximately 2 to 5 $\mu$m.

Examples of the process of the production and the properties of the semiconductor laser of FIGS. 3A and 3B will now be presented.

EXAMPLE 1

The liquid phase growth process was twice applied to a semiconductor substrate, which had a plane of Miller Indices (100), of n type InP to which tin(Sn) was doped in a concentration of approximately $1 \times 10^{18}$ cm$^{-3}$ and having the index of refraction of n=3.205. In the first growth process, a buffer first clad layer of n type InP, to which Sn was doped in a concentration of approximately $1 \times 10^{18}$ cm$^{-3}$, which had a thickness of approximately 7 $\mu$m and an index of refraction of n=3.205, was formed. Then, an undoped active layer of In$_{1-x}$Ga$_x$As$_y$P$_{1-y}$, where X was approximately 0.3 and Y was approximately 0.64, having a thickness of approximately 0.2 $\mu$m and an index of refraction of n=3.52, was formed. After that a second clad layer of p type InP, to which cadmium (Cd) was doped in a concentration of approximately $3 \times 10^{17}$ cm$^{-3}$, having a thickness of approximately 0.3 $\mu$m and an index of refraction of n=3.205, was formed. Then, a buried layer of n type In$_{1-x}$Ga$_x$As$_y$P$_{1-y}$, where X was approximately 0.3 and Y was approximately 0.64, to which Sn was doped in a concentration of approximately $1 \times 10^{18}$ cm$^{-3}$, having a thickness of approximately 1 $\mu$m and an index of refraction of n=3.5, was formed. Although the values of x and y of the buried layer are the same as those of the undoped active layer, the index of refraction of the buried layer is different from that of the undoped active layer, because Sn is doped in a concentration of approximately $1 \times 10^{18}$ cm$^{-3}$ in the buried layer. After that, a portion of said buried layer having the width w, which determines the light emitting region, was removed by means of a selective etching process with an etching solution of suphuric acid-hydrogen peroxide type, using a masking layer of silicon dioxide (SiO$_2$) layer which covered the selected portions of said buried layer. Then, the masking layer of silicon dioxide layer was removed, and a melting back process was carried out.

In the second growth process, on the etched buried layer, an additional second clad layer of p type InP, to which Cd was doped in a concentration of approximately $3 \times 10^{17}$ cm$^{-3}$, having a thickness of approximately 1 $\mu$m and an index of refraction of n=3.205 was formed. Then an ohmic contact layer of p type In$_{1-x}$Ga$_x$As$_y$P$_{1-y}$, to which Cd was doped in a concentration of approximately $3 \times 10^{18}$ cm$^{-3}$, having a thickness of 1 $\mu$m, was formed. Thus, in the second growth process, the portion of the buried layer having the width w, which was removed in the etching process, was again filled with the grown second clad layer. A positive and a negative electrode of gold-zinc (Au-Zn) and Au-Ge-Ni were applied by means of a vapor deposition process. Then, the end mirror with Miller Indices (110) were formed by means of a cleaving process. The cavity length of the produced semiconductor laser was approximately 200 to 300 $\mu$m.

The produced semiconductor laser was able to oscillate with the threshold current of approximately 50 to 80 mA, at room temperature. The constitution parameters x and y of the active layer were selected so as to make the oscillation wavelength equal to 1.3 $\mu$m. The external differential quantum efficiency was approximately 15 to 40%. It should be noted that, in the prior art semiconductor laser, the threshold current is greater than 100 mA and the external differential quantum efficiency is approximately 10 to 20%.

Figure 5:
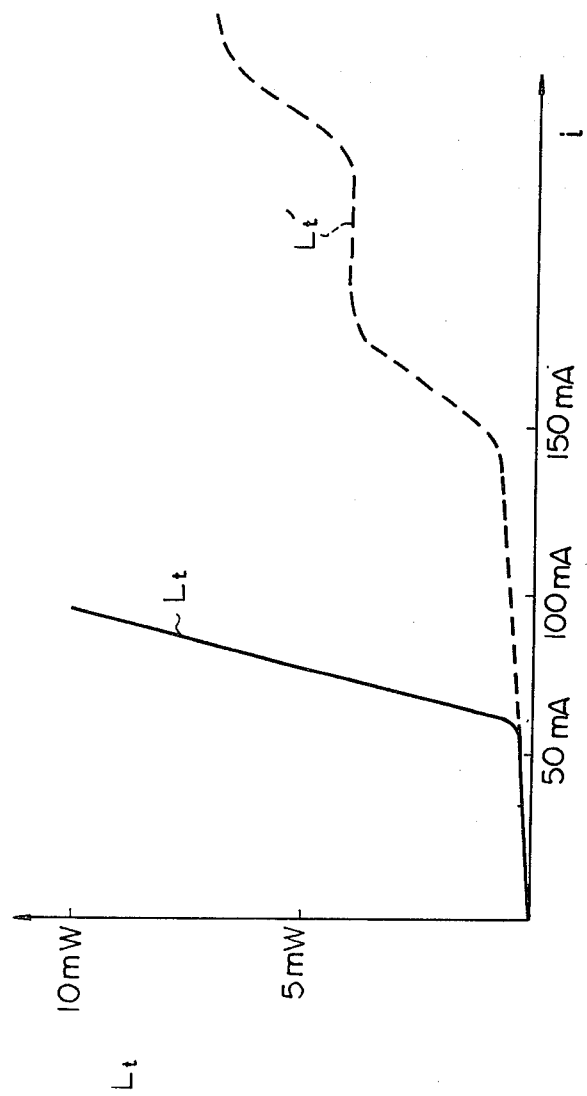
FIG. 5 illustrates the relationship between the current and the total light output of the semiconductor laser of an embodiment of the present invention and the prior art.
Figure 6:
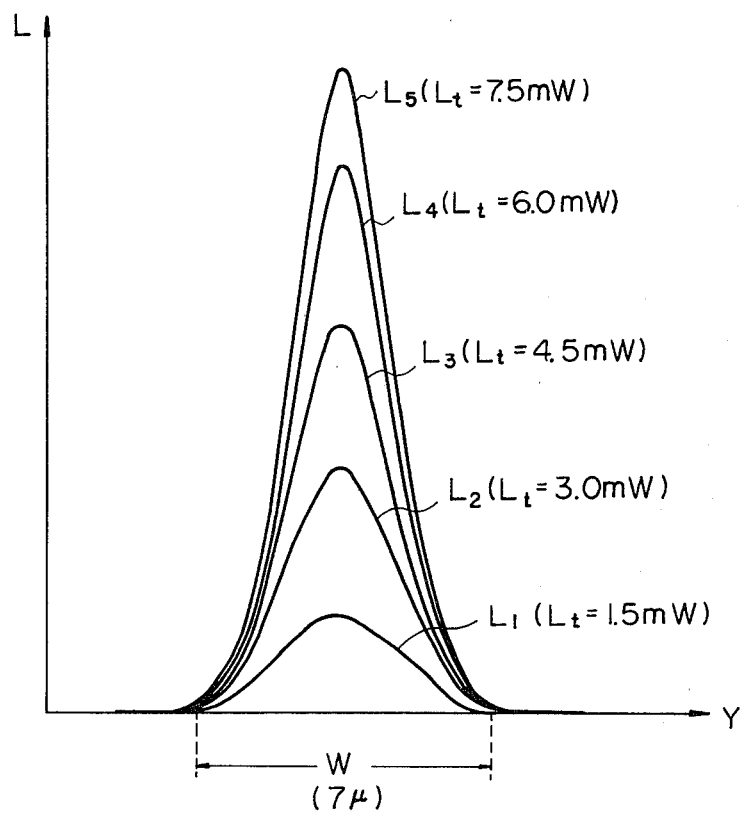
FIG. 6 illustrates the distribution of the light output of the semiconductor laser of an embodiment of the present invention.

The relationship between the current and the optical output per facet, and the distribution of the optical output along the Y-direction of the semiconductor laser in accordance with this example are illustrated in FIGS. 5 and 6, respectively. In FIG. 5, the curve $L_t$, which indicates the total optical output of the semiconductor laser in accordance with this example, is linear over a current range of twice the threshold current and reaches a value for the total optical output of approximately 10 mW per facet. The curve $L_t'$, which indicates the total optical output of the prior art semiconductor laser, represents the unstable characteristic of the total optical output and enables an available value of approximately 2 to 3 mW per facet. In addition, the total optical output $L_t$ corresponding to the value of the threshold current is approximately 0.2 to 0.3 mW, which is approximately 2 to 3 times smaller than that of the prior art semiconductor laser ($L_t'$). Accordingly, an advantages value of the on-off ratio in the pulse modulation of the optical output is obtained in the semiconductor laser having the characteristic of the curve $L_t$.

In FIG. 6, the curves $L_1$ through $L_5$ indicate the distributions of the optical output corresponding to the value 1.5 mW, 3.0 mW, 4.5 mW, 6.0 mW and 7.5 mW of the total optical output $L_t$, respectively, in the case where the light emitting width w is 7 μm. Each of the curves $L_1$ through $L_5$ represents a clean Gaussian distribution, regardless of the change of the total optical output. The 7μ of w corresponds to the diameter of the core of a single mode optical fiber, so that high efficiency coupling is obtained between the semiconductor laser and the optical fiber.

In the experiments conducted by the inventors, it was confirmed that the semiconductor laser in accordance with this example operates with a single spectral oscillation in the longitudinal oscillation mode. This fact indicates that very stable oscillation is possible in accordance with this example, while usually a deviation of the center of the distribution curve and a non-Gaussian distribution curve are frequently observed when the excitation is increased over a predetermined level in the prior art semiconductor laser. Also, it was confirmed that the rising period of the pulse modulation of the optical output is approximately 100 ps, that little oscillation and fluctuation of the optical output occurs, that no noise is included in the optical output and that no deterioration of the signal to noise ratio occurs. In addition, it was confirmed that the differential resistance in the current to voltage characteristic of the semiconductor laser in accordance with this example is a low value of approximately 1 to 2 ohms, so that an advantageous diode characteristic is obtained, and the life of the semiconductor laser in accordance with this example is similar to that of the prior art semiconductor laser.

A region for confining both the current and the light is formed by a single selective etching process of this example. Thus, the number of mask aligning processes is reduced compared with the prior art in which a current confinement region and a light confinement region are formed by separate processes. The semiconductor laser in accordance with this example has an excellent heat dissipating characteristic and is easy to mount on a stem. Accordingly, the structure of the semiconductor laser and the process for producing the semiconductor laser in accordance with this example are advantageous.

EXAMPLE 2

On a semiconductor substrate of n type GaAs to which silicon (Si) was doped in a concentration of approximately $1 \times 10^{18}$ cm$^{-3}$, and having the index of refraction n=3.64, a first clad layer of n type $Ga_{1-x}Al_xAs$, where x was approximately 0.3, and of index of refraction of n=3.44, an active layer of undoped GaAs having the index of refraction of n=3.64, a second clad layer of p type $Ga_{1-x}Al_xAs$, where x was approximately 0.3 and index of refraction of n=3.44, a buried layer of n type $Ga_{1-x}Al_xAs$, where x was approximately 0.08, and index of refraction of n=3.59, and an ohmic contact layer of p type GaAs having the index of refraction of n=3.64 were formed. The processes of the growth of these layers were the same as those of Example 1.

The thickness of the first clad layer, the active layer, the second clad layer, the buried layer and the ohmic contact layer were 2 μm, 0.1 μm, 2 μm, 1 μm and 1 μm, respectively. The thickness of the portion of the second clad layer between the buried layer and the active layer was approximately 0.2 μm. A positive electrode of Ti-Pt-Au and a negative electrode of Au-Ge-Ni were formed by means of vapor deposition. The length of the semiconductor laser was approximately 250 μm.

The produced semiconductor laser was able to oscillate with a threshold current of approximately 50 mA at room temperature. The oscillation wavelength was 0.88 μm. The external differential quantum efficiency per facet was approximately 20 to 40%. The relationship between the current and the optical output per facet and the distribution of the optical output along the Y-direction of the semiconductor laser in accordance with Example 2 were similar to those illustrated in FIGS. 5 and 6.

EXAMPLE 3

On a semiconductor substrate of n type GaAs to which Sn was doped in a concentration of approximately $1 \times 10^{18}$ cm$^{-3}$, and having the index of refraction of n=3.64, a first clad layer on n type $Ga_{1-x}Al_xAs$, where x was approximately 0.6 having the index of refraction of n=3.23, an active layer of undoped $Ga_{1-x}Al_xAs$, where x was approximately 0.2, and index of refraction of n=3.50, a second clad layer of p type $Ga_{1-x}Al_xAs$, where x was approximately 0.6, and the index of refraction n=3.23, a buried layer of n type $Ga_{1-x}Al_xAs$, where x was approximately 0.4, and the index of refraction of n=3.37 and an ohmic contact layer of p type GaAs having the index of refraction of n=3.64 were formed. The processes of the growth of these layers were the same as those of Example 1, except that the selective etching after the first growth process was conducted more precisely than in Example 1 and the time of the second growth process after the melting back of the etched buried layer was controlled more precisely than in Example 1.

The thickness of the first clad layer, the active layer, the second clad layer, the buried layer and the ohmic contact layer were 15 μm, 0.1 μm, 2 μm, 1 μm and 1 μm, respectively. The thickness of the portion of the second clad layer between the buried layer and the active layer was approximately 0.2 μm. A positive electrode of Ti-Pt-Au and a negative electrode of Au-Ge-Ni were formed by means of vapor deposition. The length of the semiconductor laser was approximately 250 to 400 μm.

The produced semiconductor laser was able to oscillate with a threshold current of approximately 100 mA, at room temperature. The oscillation wave length was 0.74 μm. The external differential quantum efficiency per facet was approximately 10 to 30%. The relationship between the current and the optical output per facet and the distribution of the optical output along the Y-direction of the semiconductor laser in accordance with Example 3, were similar to those illustrated in FIGS. 5 and 6. In Example 3, a semiconductor laser which emitted the visible light was obtained. This type of semiconductor laser can be used for an apparatus utilizing visible light related to computers, such as laser printers, optical discs and the like. In example 3, in which the oscillation wavelength of 0.75 μm was obtained by using $Ga_{1-x}Al_xAs$, no remarkable increase of the value of the threshold current occurred compared with the semiconductor laser which does not contain Al. This fact indicates that the indirect transition has little effect.

EXAMPLE 4

The liquid phase growth process was twice applied to a semiconductor substrate, having the plane of Miller Indices (100), of n type InP to which Sn was doped in a concentration of approximately $1 \times 10^{18}$ cm$^{-3}$, having the index of refraction of n=3.205.

In the first growth process, a buffer layer of n type InP, to which Sn was doped in a concentration of approximately $1 \times 10^{18}$ cm$^{-3}$, having an index of refraction of n=3.205 and a thickness of 5 μm, a first clad layer of $In_{1-x}Ga_xAs_yP_{1-y}$, where X was approximately 0.17 and Y was approximately 0.37, to which Sn was doped in a concentration of approximately $1 \times 10^{18}$ cm$^{-3}$, having a thickness of approximately 1.5 μm and an index of refraction of n=3.35, an undoped active layer of $In_{1-x}Ga_xAs_yP_{1-y}$, where X was approximately 0.3 and Y was approximately 0.64, having a thickness of approximately 0.2 μm and an index of refraction of n=3.52, a second clad layer of p type $In_{1-x}Ga_xAs_yP_{1-y}$, where X was approximately 0.17 and Y was approximately 0.37, to which Cd was doped in a concentration of approximately $1 \times 10^{17}$ cm$^{-3}$, having a thickness of approximately 0.3 μm and an index of refraction of n=3.35, and a buried layer of n type InP, to which Sn was added in a concentration of approximately $1 \times 10^{18}$ cm$^{-3}$, having a thickness of approximately 1 μm and an index of refraction of n=3.205, were grown successively. After that, the buried layer was selectively covered by a silicon dioxide layer and then, a portion of the buried layer having a width w, which defines the light emitting region, was removed by means of a selective etching process with an etching solution of HCl using the silicon dioxide layer as a masking layer. Then, after the SiO$_2$ layer was removed, an additional portion of the second clad layer of p type $In_{1-x}Ga_xAs_yP_{1-y}$, to which Cd was doped in a concentration of approximately $3 \times 10^{17}$, having a thickness of approximately 1 μm and an index of refraction of n=3.35, and an ohmic contact layer of p type $In_{1-x}Ga_xAs_yP_{1-y}$ where X was approximately 0.3 and Y was approximately 0.64, to which Cd was doped in a concentration of approximately $3 \times 10^{18}$ cm$^{-3}$, having a thickness of approximately 1 μm and an index of refraction of n=3.5, were grown successively in the second growth process. In the second growth process, the portion of the buried layer having the width w which was removed by the etching process was again filled with the grown second clad layer. A positive and a negative electrode of Au-Zn and Au-Ge-Ni were applied by means of vapor deposition. Then, the end mirrors with Miller Indices (110) were formed by means of the cleaving process. The cavity length of the produced semiconductor laser was approximately 200 to 300 μm.

The produced semiconductor laser was able to oscillate with a threshold current of approximately 60 to 100 mA, at room temperature. The constitution ratios x and y of the active layer were selected so as to make the oscillation wavelength equal to 1.3 μm. The external differential quantum efficiency was approximately 10 to 35%.

The characteristics of the produced semiconductor laser were similar to those illustrated in FIGS. 5 and 6.

EXAMPLE 5

On a semiconductor substrate of n type GaAs, to which Si was doped in a concentration of approximately $1 \times 10^{18}$ cm$^{-3}$, having an index of refraction of n=3.64, a first clad layer of n type $Ga_{1-x}Al_xAs$, where x was approximately 0.3, having an index of refraction of n=3.44, an undoped active layer of GaAs, having an index of refraction of n=3.64, a second clad layer of p type $Ga_{1-x}Al_xAs$, where x was approximately 0.3, having an index of refraction of n=3.44, a buried layer of n type $Ga_{1-x}Al_xAs$, where x was approximately 0.4, having the index of refraction of n=3.37 and an ohmic contact layer of p type GaAs, having an index of refraction of n=3.64, were formed successively.

The processes of the growth of these layers were the same as those of Example 4, except that the time of the second growth process of the second clad layer after the selective etching was controlled more precisely than in Example 4 by using a melting back process of the etched buried layer.

The produced semiconductor laser was able to oscillate with a threshold current of approximately 60 mA, at room temperature. The oscillation wavelength was 0.88 μm. The external differential quantum efficiency per facet was approximately 20 to 40%.

The characteristics of the produced semiconductor laser were similar to those illustrated in FIGS. 5 and 6.

Figure 7A:
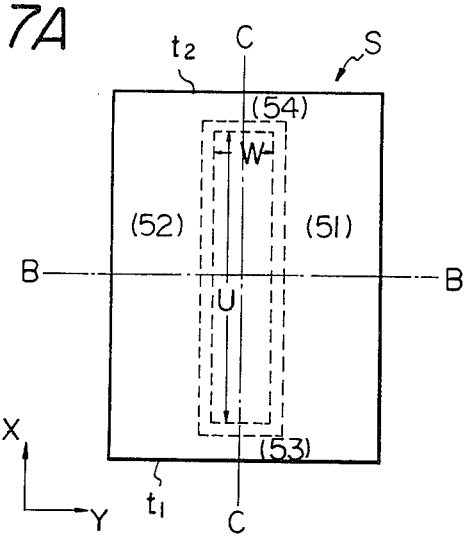
FIGS. 7A, 7B and 7C illustrate the structure of a semiconductor laser in accordance with another embodiment of the present invention.
Figure 7B:
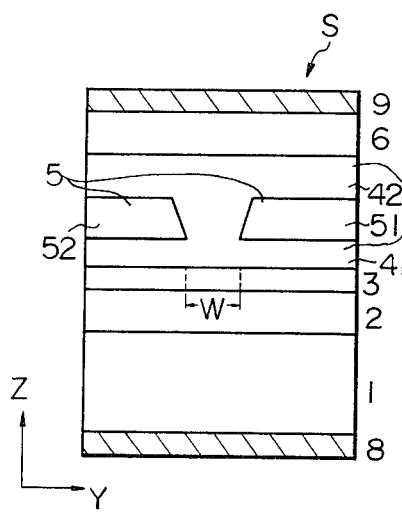
Figure 7C:
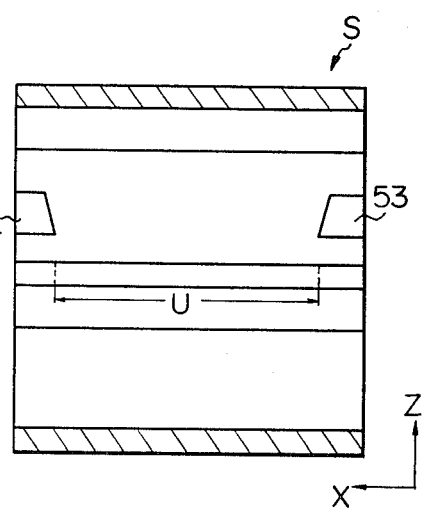

A modified embodiment of the present invention is illustrated in FIGS. 7A, 7B and 7C. In the structure of FIGS. 7A, 7B and 7C, the buried layer 5 consists of the portions 51, 52, 53 and 54, the conductivity type of which is opposite to the conductivity type of the second clad layer 4. The portion 51 and 52 are formed along the X-direction, while the portions 53 and 54 are formed along the end surfaces $t_1$ and $t_2$.

The characteristics and the effects of the portions 51 and 52 of the buried layer 5 of FIGS. 7A, 7B and 7C are the same as those of the portions 51 and 52 of the buried layer 5 of FIGS. 3A and 3B. The effects of the portions 53 and 54 are to prevent optical damage and temperature rise caused by a concentration of light outputs on the end surfaces $t_1$ and $t_2$ of the semiconductor laser.

An example of the process of the production and the properties of the semiconductor laser of FIGS. 7A, 7B and 7C will now be described.

EXAMPLE 6

A liquid phase growth process was twice applied to a semiconductor substrate, having a plane of Miller Indices (100), of n type InP, to which Sn was doped in a concentration of approximately $1 \times 10^{18}$ cm$^{-3}$. In the first growth process, a buffer first clad layer of n type InP, to which Sn was doped in a concentration of approximately $1 \times 10^{18}$ cm$^{-3}$, having a thickness of approximately 7 μm and an index of refraction of n=3.5, was formed and, then, an undoped active layer of $In_{1-x}Ga_xAs_yP_{1-y}$ having X was approximately 0.3 and Y was approximately 0.64, having a thickness of approximately 0.2 μm, was formed. After that, a second clad layer of p type InP, to which Cd was doped in a concentration of approximately $3 \times 10^{17}$ cm$^{-3}$, having a thickness of approximately 0.3 μm and an index of refraction of n=3.205, was formed and, then, a buried layer of n type $In_{1-x}Ga_xAs_yP_{1-y}$ where X was approximately 0.3 and Y was approximately 0.64, to which Sn was doped in a concentration of approximately $1 \times 10^{18}$ cm$^{-3}$, having a thickness of approximately 1 μm and an index of refraction of n=3.5, was formed. After that, a portion of the buried layer having the width w and the length U, which determines the light emitting region, was removed by means of a selective etching process with an etching solution of sulphuric acid-hydrogen peroxide type using a masking layer of silicon dioxide which covered the selected portions of the buried layer, so that the buried layer 5 of a frame configuration consisting of the portions 51, 54, 52 and 53 were formed. Then, said masking layer of silicon dioxide was removed.

In the second growth process, on the etched buried layer, an additional second clad layer of p type InP, to which Cd was doped in a concentration of approximately $3 \times 10^{17}$ cm$^{-3}$, having a thickness of approximately 1 μm, was formed and, then, an ohmic contact layer of p type $In_{1-x}Ga_xAs_yP_{1-y}$ where X was approximately 0.3 and Y was approximately 0.64, to which Cd was doped in a concentration of approximately $3 \times 10^{18}$ cm$^{-3}$, having a thickness of 1 μm was formed. Thus, in the second growth process, the portion of the buried layer having the width w and the length U, which was removed in the etching process, was again filled with the grown second clad layer. A positive and a negative electrode of Au-Zn and Au-Ge-Ni were applied by means of a vapor deposition process. Then, end mirrors with Miller indices (110) were formed by means of a cleaving process. The constitution ratios x and y of the active layer were selected so as to make the oscillation wavelength equal to 1.3 μm. The length of each of the portions 53 and 54 of FIGS. 7A and 7C was 20 μm. The length U of FIGS. 7A and 7C was 260 μm.

The produced semiconductor laser was able to oscillate with a threshold current of approximately 50 to 80 mA, at room temperature. The produced semiconductor laser was mounted on a heat sink made of diamond and was operated continuously by a driving voltage of 1.2 V and a driving current of 120 mA, at 25° C. The temperatures at the middle of the length U, at the ends of the length U and at the surfaces $t_1$ and $t_2$ were 28° C., 35° C. and 30° C., respectively. These temperatures indicate temperature rises of 3° C., 10° C. and 5° C., respectively. It should be noted that, in the semiconductor laser illustrated in FIGS. 1A and 1B, the temperatures at the middle of the length U' and at the surfaces $t'_1$ and $t'_2$ are 30° C. and 35° C., respectively. These temperatures 30° C. and 35° C. indicate temperature rises of 5° C. and 10° C., under the same operating condition as that of FIGS. 7A, 7B and 7C.

In this Example 6, the temperature rise in the light emitting surface is limited below a predetermined level, and the secular variation or deterioration of the light emitting surface is prevented. Thus, the extended life and the increased reliability of the semiconductor light emitting device are attained. The length of the portions 53 and 54 are selected to be approximately 5 through 15% of the entire length U of the semiconductor light emitting device.

Various modifications to the above described embodiments are possible. For example, semiconductor materials of the compounds of Group III-Group V elements or Group II-Group VI elements, such as Ga-Al-As, Ga-Al-As-Sb, Ga-Al-As-P, Ga-As-P and In-Ga-As-P, can be used for the materials of the layers of the semiconductor laser. Also, for example, the buried layer can be formed in the first clad layer or in both the first and second clad layers, instead of being formed in the second clad layer in the embodiments described hereinbefore.

What is claimed is:

1. A semiconductor light emitting device comprising, a semiconductor substrate,
   a first clad layer of semiconductor formed on the semiconductor substrate,
   an active layer of semiconductor formed on the first clad layer,
   a second clad layer of semiconductor formed on the active layer,
   electrodes arranged on the second clad layer and on the bottom surface of the semiconductor substrate, respectively, and
   at least one buried layer of semiconductor buried in at least one of said clad layers, each buried layer having a conductivity type opposite to the conductivity type of the clad layer in which it is buried and an index of refraction different from the index of refraction of the clad layer in which it is buried, each said buried layer having a configuration for determining a light emitting region of said active layer.

2. The device of claim 1, wherein the index of refraction of at least one buried layer is greater by more than a predetermined value than the index of the clad layer in which it is buried.

3. The device of claim 2, wherein the index of refraction of at least one buried layer is smaller than the index of refraction of the active layer.

4. The device of claim 1, wherein the index of refraction of at least one buried layer is smaller than the index of refraction of the clad layer in which it is buried.

5. The device of claim 1 having a double heterostructure and a stripe configuration for said light emitting region.

6. The device of claim 1, wherein an ohmic contact layer is arranged on said second clad layer under the respective one(s) of said electrodes.

7. A semiconductor light emitting device as defined in claim 1, wherein the active layer has a thickness of 0.05 through 0.3 μm.

8. A semiconductor light emitting device as defined in claim 1, wherein the buried layer has a thickness of 0.2 through 2 μm.

9. A semiconductor light emitting device as defined in claim 1, wherein the portion of the clad layer between the active layer and the buried layer has a thickness of 0.2 through 0.5 μm.

10. The device of claim 1, wherein the first clad layer has a thickness in the range from 1 to 5 μm.

11. The device of claim 1, wherein the second clad layer has a thickness in the range from 2 to 5 μm.

12. The device of claim 1 or 2, the semiconductor substrate comprising InP, the first clad layer comprising InP, the active layer comprising InGaAsP, the second clad layer comprising InP and the buried layer comprising InGaAsP.

13. The device of claim 1, 2 or 3, the semiconductor substrate comprising GaAs, the first clad layer comprising GaAlAs, the active layer comprising GaAs, the second clad layer comprising GaAlAs and the buried layer comprising GaAlAs.

14. The device of claim 2 consisting of one of said buried layers, said one buried layer being buried in said second clad layer and having a higher index of refraction than said second clad layer, said first clad layer, active layer, second clad layer and buried layer having respective energy gaps Eg (1) to Eg (5), said energy gaps satisfying Eg (3)≦Eg (5), Eg (5)<Eg (2) and Eg (5)<Eg (4).

15. The device of claim 2, consisting of one of said buried layers, said one buried layer being buried in said second clad layer and having a lower index of refraction than said second clad layer, said first clad layer, active layer, second clad layer and buried layer having respective energy gaps Eg (1) to Eg (5), said energy gaps satisfying Eg (3)<Eg (2), Eg (3)<Eg (4) and Eg (4)<Eg (5).

16. A semiconductor light emitting device comprising
- a semiconductor substrate,
- a first clad layer of semiconductor formed on the semiconductor substrate,
- an active layer of semiconductor formed on the first clad layer, the active layer comprising a light emitting stripe portion
- a second clad layer of semiconductor formed on the active layer,
- electrodes arranged on the second clad layer and on the bottom surface of the semiconductor substrate, respectively, and
- at least one buried semiconductor layer in at least one of the first and the second clad layers, each said buried layer having conductivity type which is opposite to the conductivity type of the clad layer in which it is embedded and said buried layer(s) having a configuration to define said light emitting stripe portion of the active layer.

17. The device of claim 16, wherein the length of said buried layer(s) along the ends of said stripe portion is in the range from 5 to 15% of the length of the buried layer along the sides of the stripe portion.

* * * * *

UNITED STATES PATENT AND TRADEMARK OFFICE
CERTIFICATE OF CORRECTION

PATENT NO. : 4,329,660
DATED : 11 May 1982
INVENTOR(S) : YANO et al

It is certified that error appears in the above-identified patent and that said Letters Patent are hereby corrected as shown below:

Col. 1, line 16, "aluminium" should be --aluminum--.

Col. 2, line 17, "neary" should be --nearly--.

Col. 4, line 49, "tively" should be --tive$_{\frac{1}{2}}$--;

line 61, "$\pi a_\gamma^{\frac{1}{2}}$" should be --$\pi a_\gamma \Gamma^{\frac{1}{2}}$--.

Col. 7, line 4, "tages" should be --tageous--;

line 62, "0.3" should be --0.3,--.

Col. 8, line 26, "0.6" should be --0.6,--.

Col. 10, line 34, "portion" should be --portions--.

Col. 12, line 16, after "each" insert --said--.

Signed and Sealed this

Fourteenth Day of September 1982

[SEAL]

Attest:

GERALD J. MOSSINGHOFF

Attesting Officer   Commissioner of Patents and Trademarks